United States Patent
Tanaka (10) Patent No.: US 7,830,148 B2
(45) Date of Patent: Nov. 9, 2010

(54) NMR SAMPLE TUBE

(75) Inventor: Hideki Tanaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 100 days.

(21) Appl. No.: 12/191,361

(22) Filed: Aug. 14, 2008

(65) Prior Publication Data

US 2009/0066333 A1    Mar. 12, 2009

(30) Foreign Application Priority Data

Sep. 12, 2007    (JP) .............................. 2007-236526

(51) Int. Cl.
*G01V 3/00* (2006.01)

(52) U.S. Cl. ...................................... 324/321

(58) Field of Classification Search .......... 324/300–322
See application file for complete search history.

(56) References Cited

U.S. PATENT DOCUMENTS

| | | | |
|---|---|---|---|
| 5,302,900 A | | 4/1994 | Cummings |
| 6,054,857 A | * | 4/2000 | Doty ........................... 324/321 |
| 6,917,201 B2 | * | 7/2005 | de Swiet ...................... 324/321 |
| 7,068,034 B2 | * | 6/2006 | de Swiet ...................... 324/321 |
| 7,088,102 B1 | * | 8/2006 | Zens ........................... 324/321 |
| 7,106,063 B1 | * | 9/2006 | Zens et al. ................... 324/318 |
| 7,119,542 B1 | * | 10/2006 | Howard et al. ............... 324/321 |

FOREIGN PATENT DOCUMENTS

| | | | |
|---|---|---|---|
| JP | 63128244 A | * | 5/1988 |
| JP | 63-228051 | | 9/1988 |
| JP | 5-84874 | | 4/1993 |
| JP | 5-249214 | | 9/1993 |
| JP | 10-332800 | | 12/1998 |
| JP | 2001-208819 | | 8/2001 |

* cited by examiner

*Primary Examiner*—Brij B Shrivastav
*Assistant Examiner*—Dixomara Vargas
(74) *Attorney, Agent, or Firm*—Antonelli, Terry, Stout & Kraus, LLP.

(57) ABSTRACT

An NMR sample tube for NMR measurement is provided. It includes a plug on both sides or one side of a sample to be measured, in an axial direction of the sample tube. The plug is adjusted to have magnetic susceptibility equal to or substantially equal to that of the sample. A whole shape of the plug and a sample space together is axisymmetric about an axis of the sample tube, and a surface of the plug not abutting the sample space bulges in a direction away from the sample space.

7 Claims, 7 Drawing Sheets

NMR SAMPLE TUBE

BACKGROUND OF THE INVENTION (1) Field of the Invention

The present invention relates to an NMR sample tube suitable for use in a nuclear magnetic resonance signal measuring device (NMR device).

(2) Related Art

A nuclear magnetic resonance signal measuring device applies an RF magnetic field to a sample to be measured to obtain nuclear magnetic resonance signals (NMR signals) from the sample. In order to increase the strength of the signal, the static magnetic field in the sample space is required to have high homogeneity.

Since the sample is precious, a minute sample is put in a thin sample tube to measure it. The sample is usually in a form of liquid. A difference between the magnetic susceptibility of the sample and that of objects around the sample lowers the homogeneity of the static magnetic field in the sample space. If the magnetic susceptibility changes stepwise at the portion where the sample abuts surroundings therearound as viewed from the direction of the applied static magnetic field, magnetic charge appears thereon, and thus a further magnetic field is generated so that the homogeneity of the magnetic field is lowered.

JP-A-10-332800 discloses that a material having the same magnetic susceptibility as the sample is arranged below the sample, the sample is placed thereabove, and a plug adjusted to have the same magnetic susceptibility as the sample is inserted above the sample to provide a symmetrical sample tube. The plug is constituted of a first plug having a through-hole for bubble removal and a second plug fitting in the first plug.

The object of JP-A-10-332800 is removal of bubbles generated in the sample portion.

SUMMARY OF THE INVENTION

The object of the present invention is to improve the homogeneity of the static magnetic field of the sample space in an NMR sample tube with use of a plug adjusted to have magnetic susceptibility equal to or substantially equal to that of the sample.

According to the present invention, a plug having magnetic susceptibility equal to or substantially equal to that of the sample is arranged on both sides or one side of the sample to be measured, in the axial direction of the sample tube, such that the whole shape of the plug and the sample space together is axisymmetric about the axis of the sample tube, and further such that the surface of the plug not abutting the sample space bulges in the direction away from the sample space.

The magnetic susceptibility of the plug is desirably adjusted to have the same the magnetic susceptibility as that of the sample or, even if not same, the difference of the magnetic susceptibilities between the plug and the sample is within ±10% of that of the sample.

According to the present invention, the homogeneity of the static magnetic field in the sample space is increased to improve the sensitivity of NMR measurement.

Other objects, features and advantages of the invention will become apparent from the following description of the embodiments of the invention taken in conjunction with the accompanying drawings.

DETAILED DESCRIPTION OF THE INVENTION

When the static magnetic field is applied from the direction of the axis of the sample tube, a plug is placed adjacent to the sample space in the direction of the static magnetic field such that the boundary surface therebetween forms a portion of a spheroid, thereby the homogeneity of the static magnetic field of the sample space can be increased.

On the other hand, when the static magnetic field is applied from the direction perpendicular to the axis of the sample tube, the sample space is surrounded by air through the sample tube. In addition, a coil, having an axis corresponding to the axis of the sample tube, for transmitting and receiving NMR signals, needs to be arranged near the sample tube as far as possible. Therefore, in the case of this magnetic field direction, it is difficult to arrange a plug having adjusted magnetic susceptibility in the space adjacent to the sample space in the direction of the static magnetic field, so as to surround the sample space. Thus, in the case of this magnetic field direction, the sample space is generally surrounded by air.

According to the present invention, the whole area of the sample plus the plug having adjusted magnetic susceptibility is made a spheroidal shape to increase the homogeneity of the static magnetic field of the sample space. The invention is based on a nature of electromagnetism: strength of a magnetic field is constant in a spheroid having constant magnetic susceptibility.

According to a preferred embodiment of the present invention, the plug has a shape of a spheroid divided into two pieces in the axial direction with its rotational axis corresponding to the axis of the sample tube.

According to another preferred embodiment, the plug has a shape composed of: a spheroid divided into two pieces in the axial direction with its rotational axis corresponding to the axis of the sample tube; and a cylindrical portion, added on the side of a surface of the divided spheroid abutting the sample, having a length of not more than 1 mm in the direction of the axis of the sample tube.

In addition, bottom of the sample tube is sealed and a plug having such a shape as to contact closely with the bottom of the sample tube is arranged only above the sample.

In addition, the surface of the plug abutting the sample is dented in the direction away from the sample to form the shape of a half of a spheroid with its rotation axis corresponding to the axis of the sample tube, and the sample space has a shape of a spheroid.

The sample space and the plug may be surrounded by glass, and a pipe may be arranged in the glass to pass the sample.

In addition, according to a very preferable embodiment, a hole for passing the sample is provide in one or both of the plugs. Further, a plug positioning rod for passing the sample is provided on one or both of the plugs.

In the following, the present invention will be described in detail referring to the drawings.

Embodiment 1

Figure 1:
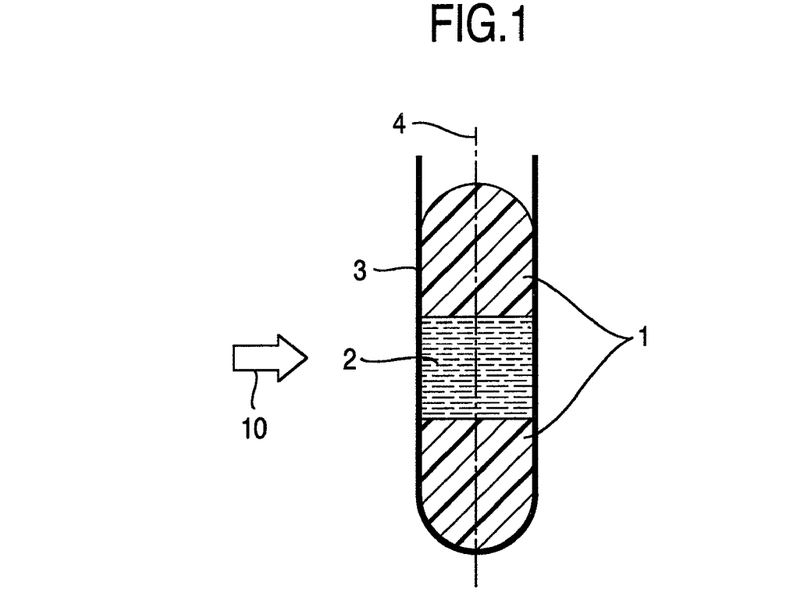
FIG. 1 is a schematic view of an NMR sample tube of Embodiment 1 according to the invention.

FIG. 1 schematically shows an NMR sample tube according to an embodiment of the present invention. A sample 2 and plugs 1 are arranged in a sample tube 3. According to the NMR sample tube of FIG. 1, the whole shape of the plugs 1 and the sample 2 together is close to a spheroid with its rotation axis corresponding to a sample tube axis 4, as viewed from a static magnetic field direction 10. In addition, cylindrical portions are provided in the plugs 1. In order to provide a good symmetrical property, desirably the plugs arranged above and below have the same shape.

Bubbles accumulating between the sample and the upper plug are one of the causes of decrease in the homogeneity of the static magnetic field. Therefore, a slight gap or groove for bubble removal may be provided between the sample tube 3 and the plug 1. In addition, the lower plug may be fabricated integrally with the sample tube 3. The level of the sample 2 is appropriately adjusted in accordance with the sensitivity region of the NMR transmitting and receiving antenna used.

The material of the plug should be changed in accordance with the sample, and is preferably resin, glass, a mixture thereof with a metal for adjustment of the magnetic susceptibility, or the like.

When a cylindrical portion is provided in the plug 1 as in the embodiment, the plug 1 is easy to fabricate and leakage of the sample 2 is little.

Embodiment 2

Figure 2:
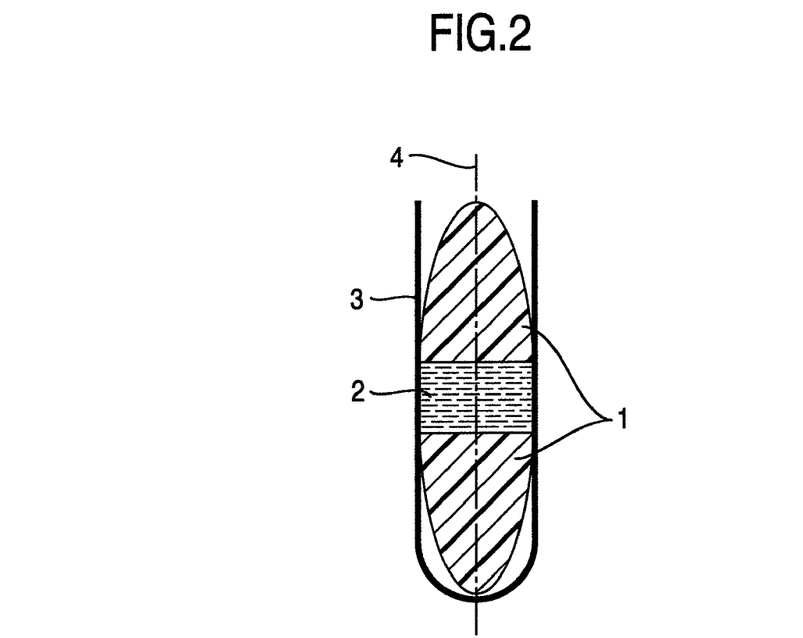
FIG. 2 is a schematic view of an NMR sample tube of Embodiment 2 according to the invention.

FIG. 2 shows a plug having no cylindrical portions. By providing a plug having no cylindrical portion or a short cylindrical portion of not more than 1 mm, the whole shape of the sample and the plug together is further closer to a spheroid than the case of Embodiment 1, thereby improving the homogeneity of the magnetic field of the sample.

Embodiment 3

Figure 3:
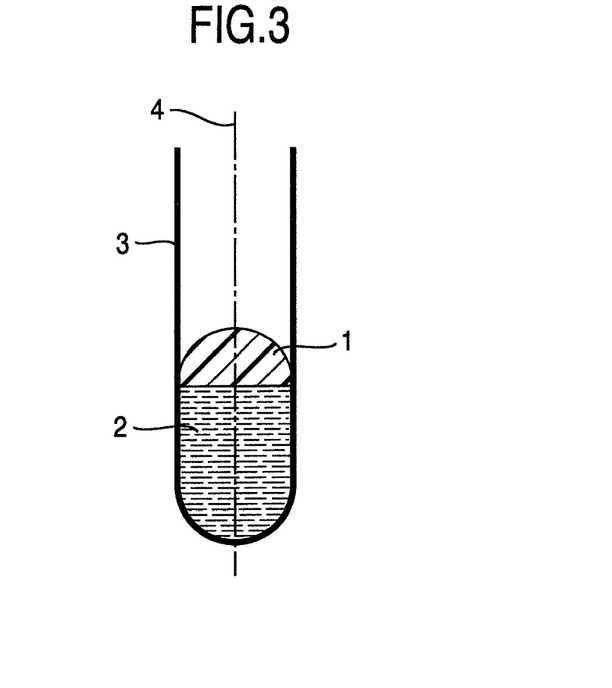
FIG. 3 is a schematic view of an NMR sample tube of Embodiment 3 according to the invention.

Referring to FIG. 3, a plug 1 is formed to have the same shape as the bottom of a sample tube 3, and the plug is arranged only above a sample 2. The whole shape of the sample 2 and the plug 1 together is also close to a spheroid, thereby improving the homogeneity of the magnetic field of the sample. The embodiment has an advantage that only one plug is employed.

Embodiment 4

Figure 4:
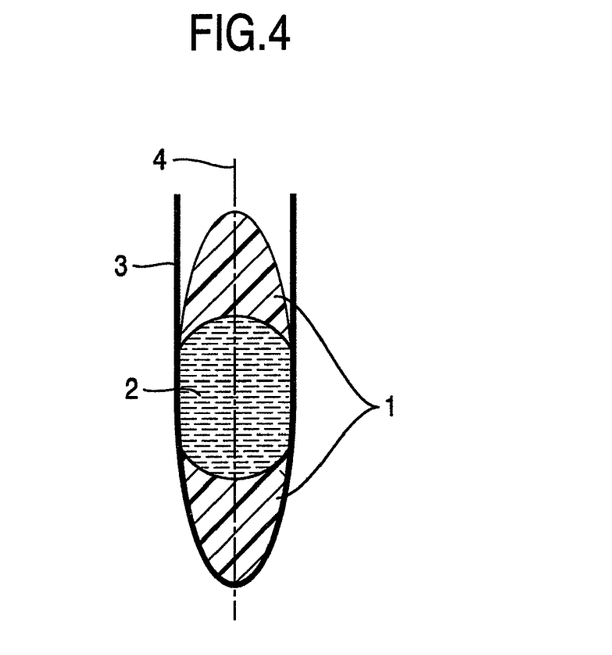
FIG. 4 is a schematic view of an NMR sample tube of Embodiment 4 according to the invention.

Referring to FIG. 4, the surfaces of plugs 1 abutting a sample 2 are hollowed out in the form of a spheroid so that the shape of the sample space is close to a spheroid. Such a configuration may also suppress an irregular magnetic field generated due to difference in magnetic susceptibility between the sample 2 and the plugs 1, thereby improving the homogeneity of the magnetic field of the sample space.

Embodiment 5

Figure 5:
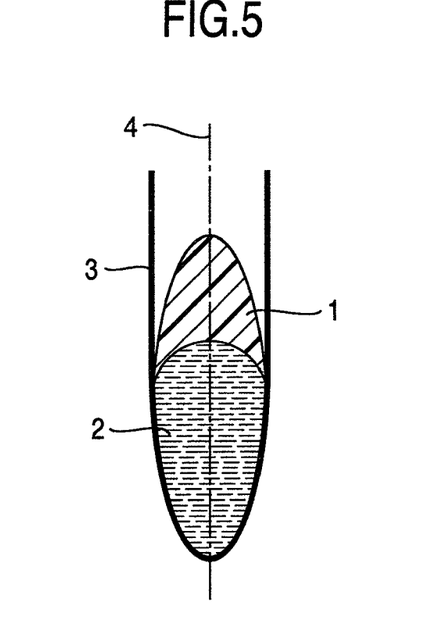
FIG. 5 is a schematic view of an NMR sample tube of Embodiment 5 according to the invention.

Referring to FIG. 5, the bottom of a sample tube 3 has a shape tapering toward the tip to form a half of a spheroid, and a plug having the shape is arranged above a sample 2. The whole shape of the sample 2 and the plug 1 together is a spheroid, thereby improving the homogeneity of the magnetic field of the sample.

Embodiment 6

Figure 6:
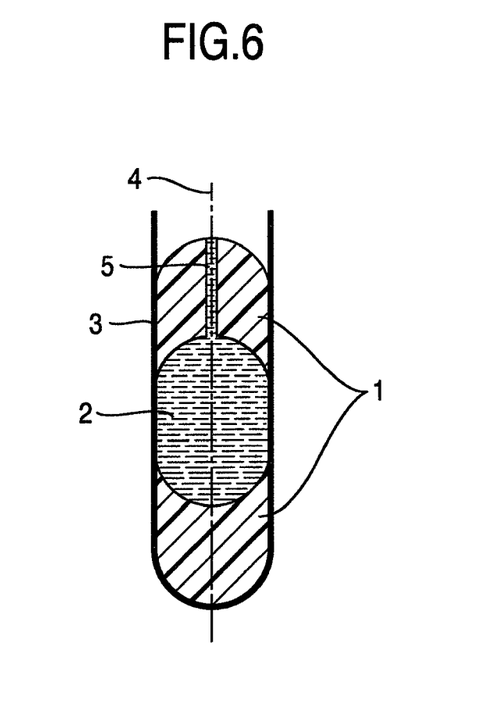
FIG. 6 is a schematic view of an NMR sample tube of Embodiment 6 according to the invention.

Referring to FIG. 6, plugs 1 are arranged above and below a sample, and the surfaces of the plugs 1 abutting the sample 2 are hollowed out in the form of a spheroid. Further, a sample passing hole (sample insertion hole) 5 is arranged in the upper plug to insert the sample therethrough. The sample passing hole 5 may also be used to drive out bubbles. If the sample in the sample passing hole 5 is not to be measured, the sample passing hole 5 may be made as thin as possible or be plugged.

Embodiment 7

Figure 7:
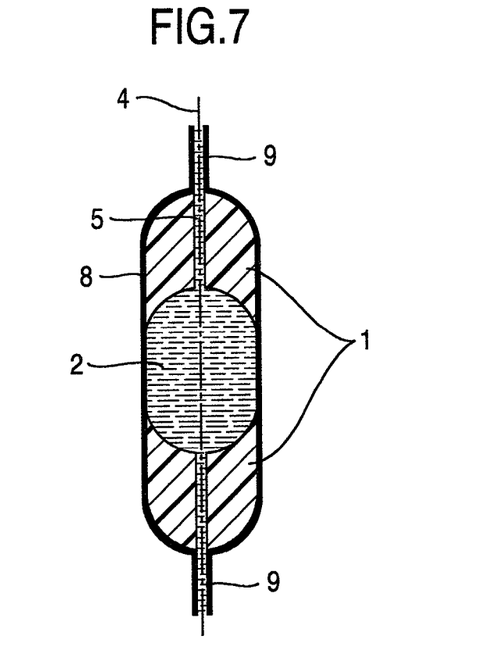
FIG. 7 is a schematic view of an NMR sample tube of Embodiment 7 according to the invention.

According to FIG. 7, plugs 1 are arranged above and below a sample, and a sample passing hole 5 is arranged in each of the plugs. Further, a sample insertion pipe 9 is provided on the sample tube. The sample 2 may be put in and taken out, and may be circulated, through the sample insertion pipe 9. In the embodiment, the plugs are covered with a sample tube 8 integrated with the sample-insertion-pipe, so that the positions of the sample 2 and plugs 1 are fixed. The sample tube 8 integrated with the sample-insertion-pipe may be fabricated of glass or plastic, and desirably has a uniform thickness.

In the embodiment, the amount of the sample to be measured and its position relative to the plugs are fixed, and only the sample may be exchanged by flowing it in the sample space to measure it. As a result, the time period for exchange of the sample may be shortened and such a measurement is also enabled that the concentration of the sample is continuously varied.

Embodiment 8

Figure 8:
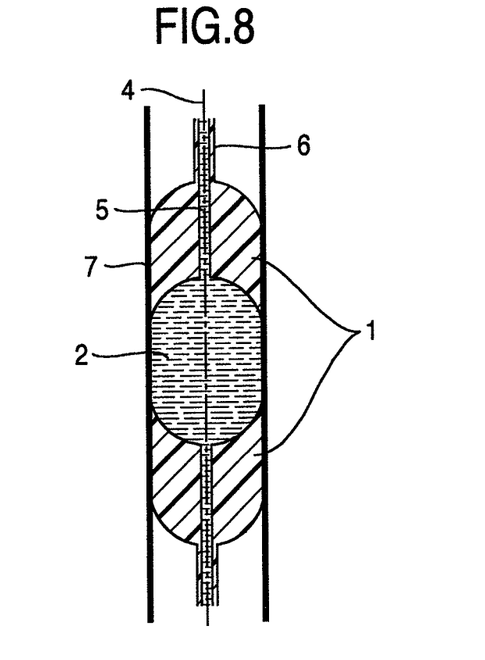
FIG. 8 is a schematic view of an NMR sample tube of Embodiment 8 according to the invention.

Referring to FIG. 8, positioning rods 6 of plugs are arranged in the form of extension of sample passing holes 5 of the plugs 1. In addition, a sample tube 7 is in the form of a pipe or is shaped to have a sufficiently long straight portion, so that the plugs can be moved to positions according to the volume of the sample. Although the positioning rods 6 are arranged on both plugs in the embodiment, a positioning rod 6 may be provided on one plug in the case of a sample tube is sealed at its one end.

Embodiment 9

Figure 9:
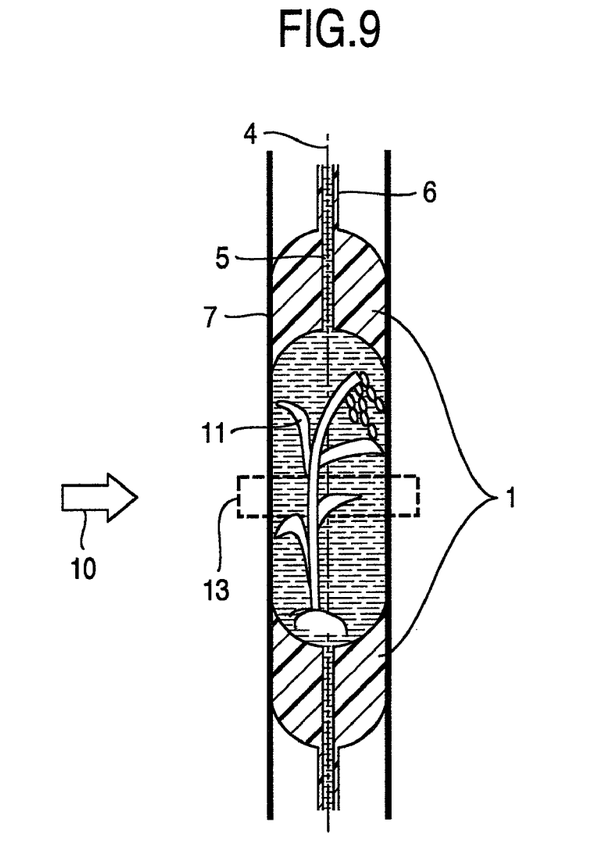
FIG. 9 is a schematic view of an NMR sample tube of Embodiment 9 according to the invention.

Referring to FIG. 9, a hydrophyte 11 is arranged as a sample in the embodiment shown in FIG. 8. According to the embodiment, cell fluid or discharged fluid of a plant may be measured. While a sensitivity region 13 of the NMR device is usually fixed, a portion to be measured can be positioned in the sensitivity region 13 by moving the plugs 1 up and down. In the embodiment, the axis of the sample tube is made vertical in order to adapt to the natural shape of the hydrophyte.

Embodiment 10

Figure 10:
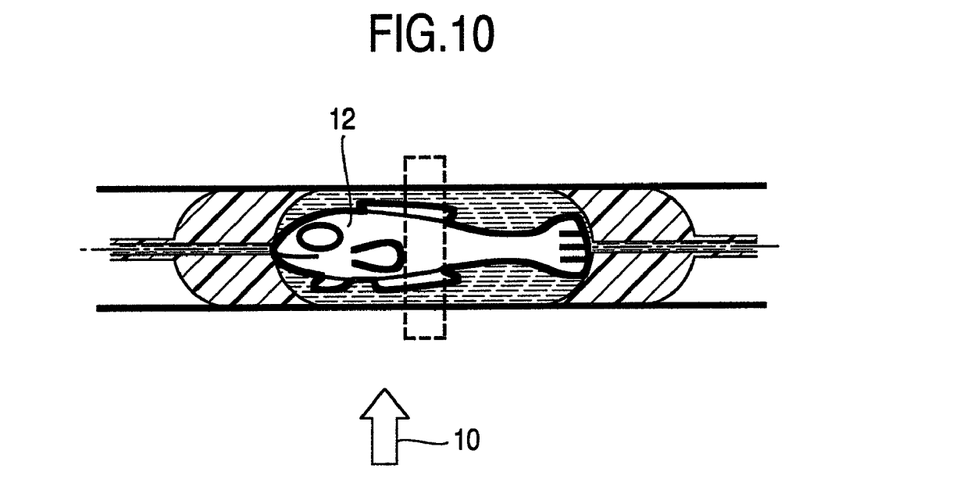
FIG. 10 is a schematic view of an NMR sample tube of Embodiment 10 according to the invention.

Referring to FIG. 10, a fish, as an example of an underwater animal 12, is arranged in a measurement space. The axis of the sample tube is made horizontal since the sample tube needs to be horizontally long in order to accommodate the underwater animal 12 in the sample tube in a natural form. Other configurations are the same as those shown in FIG. 9.

Embodiment 11

Figure 11:
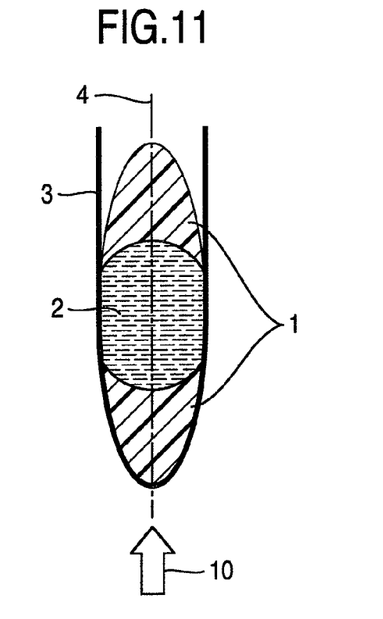
FIG. 11 is a schematic view of an NMR sample tube of Embodiment 11 according to the invention.

FIG. 11 shows a case where a static magnetic field direction 10 is parallel to a sample tube axis 4. Even in a case where, as in the embodiment, the magnetic field direction 10 corresponds to the sample tube axis 4, the whole shape of the plugs 1 and the sample 2 together is a spheroid so that the homogeneity of the magnetic field of the sample space may be improved.

Embodiment 12

Figure 12:
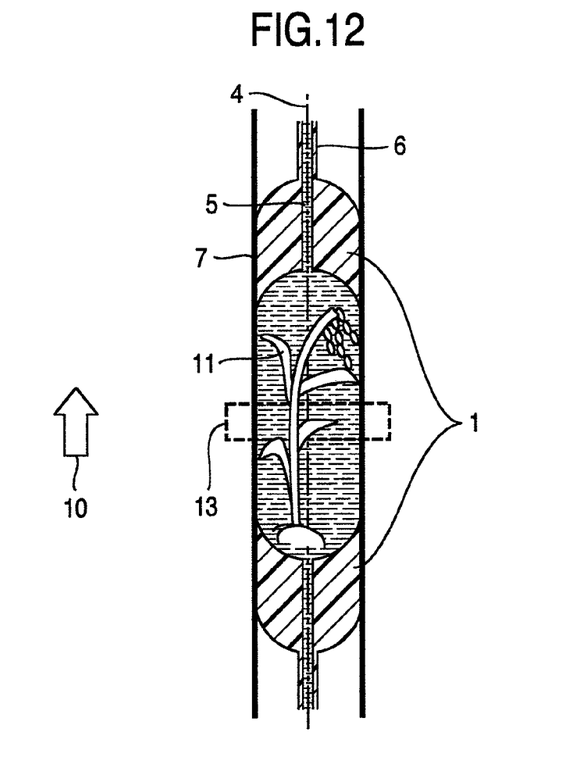
FIG. 12 is a schematic view of an NMR sample tube having a hydrophyte arranged in the sample space.
Figure 13:
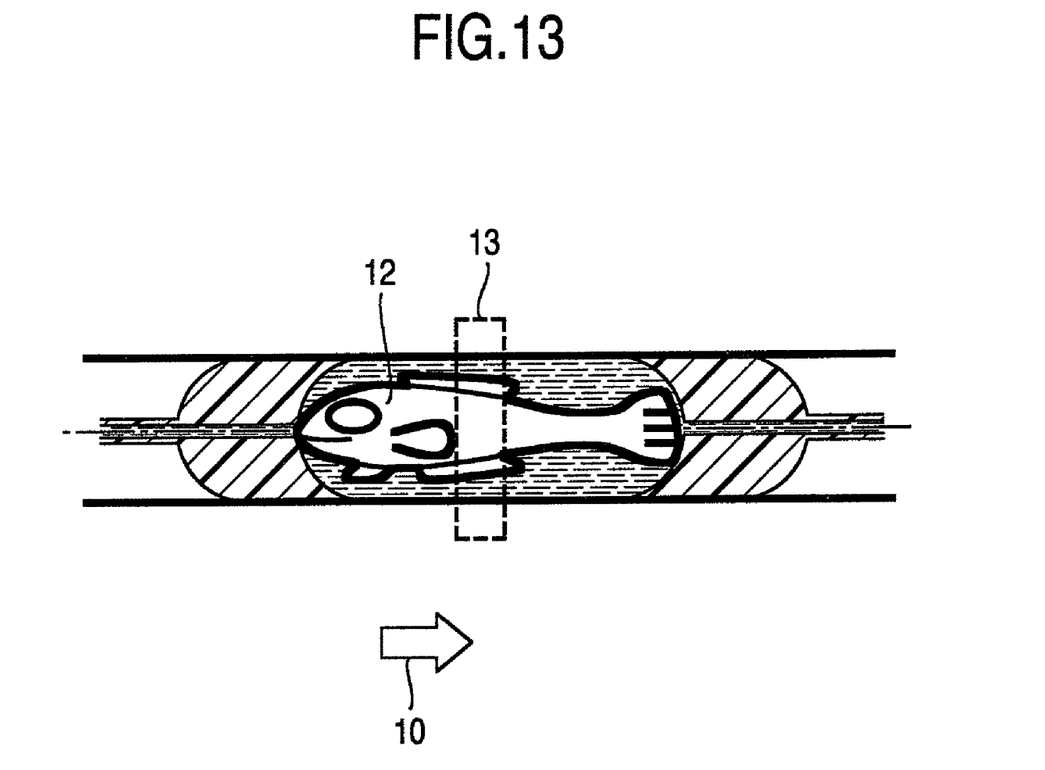
FIG. 13 is a schematic view of an NMR sample tube having an underwater animal arranged in the sample space.

FIG. 12 shows an example of an arrangement of a hydrophyte 11 in a case where a static magnetic field direction 10 corresponds to a sample tube axis 4. FIG. 13 shows an example of an arrangement of an underwater animal 12 in a case where the static magnetic field direction 10 corresponds to the sample tube axis 4.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An NMR sample tube for NMR measurement, comprising a plug on both sides or one side of a sample to be measured, in an axial direction of the sample tube, the plug being adjusted to have magnetic susceptibility equal to or substantially equal to that of the sample, wherein a whole shape of the plug and a sample space together is spheroid with a rotational axis corresponding to an axis of the sample tube.

2. The NMR sample tube according to claim 1, wherein the plug has a shape obtained by dividing a spheroid into two pieces in the axial direction, the spheroid having a rotation axis corresponding to the axis of the sample tube, and adding a cylindrical portion having a length of not more than 1 mm in the axial direction of the sample tube, to the divided spheroid on a side of its surface abutting the sample.

3. The NMR sample tube according to claim 1, wherein bottom of the sample tube is sealed and a plug having such a shape as to contact closely with the bottom of the sample tube is arranged only above the sample.

4. The NMR sample tube according to claim 1, wherein a surface of the plug abutting the sample is dented in a form of a half of a spheroid, the spheroid having a rotation axis corresponding to the axis of the sample tube, in a direction away from the sample, and the sample space has a shape of a spheroid.

5. The NMR sample tube according to claim 1, wherein the sample space and the plug are surrounded by glass, and a pipe is arranged in the glass to pass the sample.

6. An NMR sample tube for NMR measurement, comprising a plug on both sides or one side of a sample to be measured, in an axial direction of the sample tube, the plug being adjusted to have magnetic susceptibility equal to or substantially equal to that of the sample, wherein a whole shape of the plug and a sample space together is spheroid with a rotational axis corresponding to an axis of the sample tube; and a hole is provided in one or both of the plugs to pass the sample.

7. An NMR sample tube for NMR measurement, comprising a plug on both sides or one side of a sample to be measured, in an axial direction of the sample tube, the plug being adjusted to have magnetic susceptibility equal to or substantially equal to that of the sample, wherein a whole shape of the plug and a sample space together is spheroid with a rotational axis corresponding to an axis of the sample tube; and a plug positioning rod is provided on one or both of the plugs to pass the sample.

* * * * *